United States Patent
Williamson et al.

(10) Patent No.: US 12,489,075 B2
(45) Date of Patent: Dec. 2, 2025

(54) ENHANCED MOLD COMPOUND THERMAL CONDUCTIVITY

(71) Applicant: TEXAS INSTRUMENTS INCORPORATED, Dallas, TX (US)

(72) Inventors: Jaimal Mallory Williamson, McKinney, TX (US); Hiep Xuan Nguyen, Cedar Hill, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/219,681

(22) Filed: Mar. 31, 2021

(65) Prior Publication Data

US 2022/0122936 A1    Apr. 21, 2022

Related U.S. Application Data

(60) Provisional application No. 63/094,149, filed on Oct. 20, 2020.

(51) Int. Cl.
*H01L 23/00* (2006.01)
*H01L 23/31* (2006.01)
*H01L 23/498* (2006.01)

(52) U.S. Cl.
CPC .......... *H01L 24/20* (2013.01); *H01L 23/3114* (2013.01); *H01L 23/3128* (2013.01);
(Continued)

(58) Field of Classification Search
CPC .......... H01L 23/49827; H01L 23/5384; H01L 23/481; H01L 29/4175; H01L 2225/06541–06544; H01L 2225/06548; H01L 21/76898; H01L 21/56; H01L 21/563; H01L 21/565–566; H01L 23/4334; H01L 25/0657; H01L 25/074; H01L 2225/06568; H01L 2225/06555; H01L 21/8221; H01L 23/3185; H01L 23/3157; H01L 23/42–427; H01L 23/433; H01L 21/486; H01L 25/043;
(Continued)

(56) References Cited

U.S. PATENT DOCUMENTS

| 10,672,729 B2 * | 6/2020 | Tai ...................... H01L 23/3114 |
| 2013/0186676 A1 * | 7/2013 | Yu .......................... H01L 24/19 29/829 |

(Continued)

*Primary Examiner* — Wael M Fahmy
*Assistant Examiner* — Quinton A Brasfield
(74) *Attorney, Agent, or Firm* — Dawn Jos; Frank D. Cimino

(57) ABSTRACT

In examples, a semiconductor package comprises a semiconductor die having a first surface on which circuitry is formed and a second surface opposite the first surface. The semiconductor package includes a mold compound, the second surface facing the mold compound. The mold compound covers the semiconductor die; a set of conductive vias exposed to a top surface of the mold compound and coupled to a metal layer in the package; a set of first conductive members vertically aligned with the semiconductor die and exposed to the top surface of the mold compound; and a set of second conductive members coupling at least some of the set of conductive vias to at least some of the set of first conductive members. The set of second conductive members is exposed to the top surface of the mold compound.

20 Claims, 12 Drawing Sheets

(52) U.S. Cl.
CPC ........ *H01L 23/49822* (2013.01); *H01L 24/16* (2013.01); *H01L 24/32* (2013.01); *H01L 24/73* (2013.01); *H01L 2224/16225* (2013.01); *H01L 2224/211* (2013.01); *H01L 2224/32225* (2013.01); *H01L 2224/73204* (2013.01)

(58) Field of Classification Search
CPC ............... H01L 25/0652; H01L 25/071; H01L 25/0756; H01L 25/112; H01L 25/117; H01L 23/3107–3192; H01L 21/561; H01L 23/5389; H01L 23/3677
See application file for complete search history.

(56) References Cited

U.S. PATENT DOCUMENTS

| | | | |
|---|---|---|---|
| 2015/0262909 A1* | 9/2015 | Chen | H01L 24/82 438/126 |
| 2015/0348863 A1* | 12/2015 | Du | H01L 23/367 257/796 |
| 2017/0271248 A1* | 9/2017 | Chen | H01L 23/5389 |
| 2019/0096791 A1* | 3/2019 | Jeng | H01L 21/56 |
| 2019/0181120 A1* | 6/2019 | Chiang | H01L 23/49811 |
| 2020/0006196 A1* | 1/2020 | Lin | H01L 23/5389 |
| 2020/0058606 A1* | 2/2020 | Tsai | H01L 23/481 |
| 2020/0083201 A1* | 3/2020 | Suk | H01L 24/09 |
| 2020/0350285 A1* | 11/2020 | Ho | H01L 23/5385 |
| 2021/0035878 A1* | 2/2021 | Jin | H01L 23/5226 |
| 2021/0098381 A1* | 4/2021 | Yu | H01L 21/4857 |
| 2021/0134754 A1* | 5/2021 | Tsukada | H01L 23/36 |
| 2021/0280507 A1* | 9/2021 | Aldrete | H01L 21/568 |
| 2021/0343634 A1* | 11/2021 | Choi | H01L 23/49838 |
| 2023/0178442 A1* | 6/2023 | Dou | H01L 23/58 438/15 |

* cited by examiner

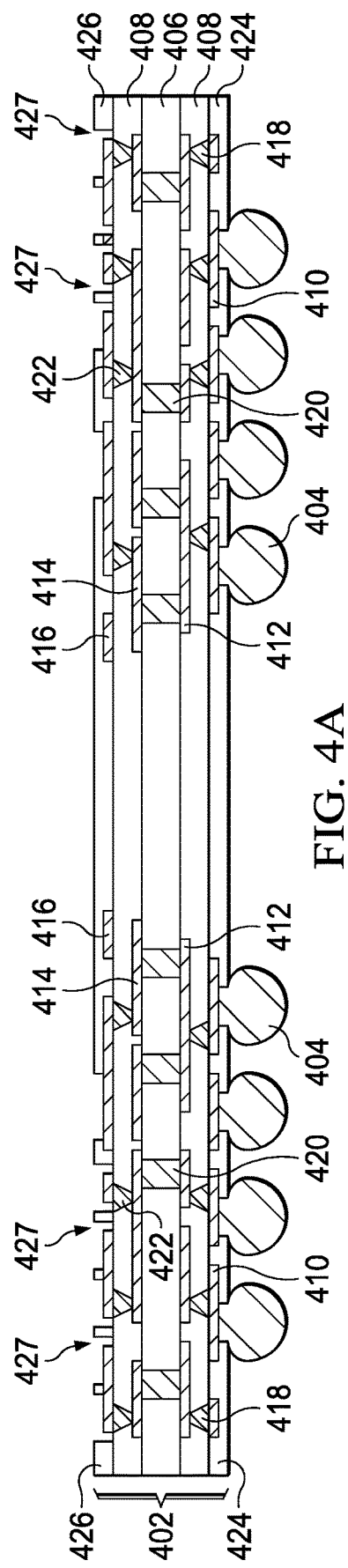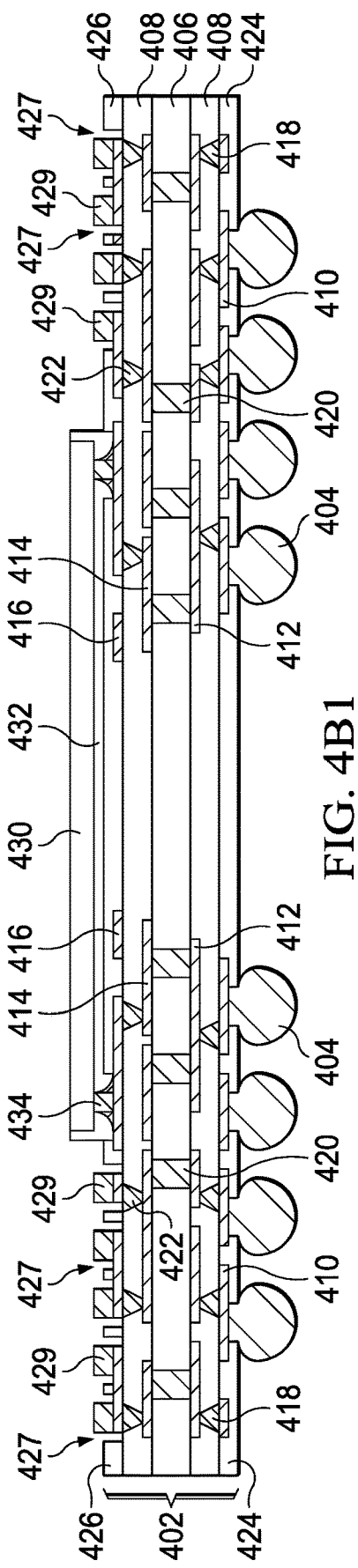

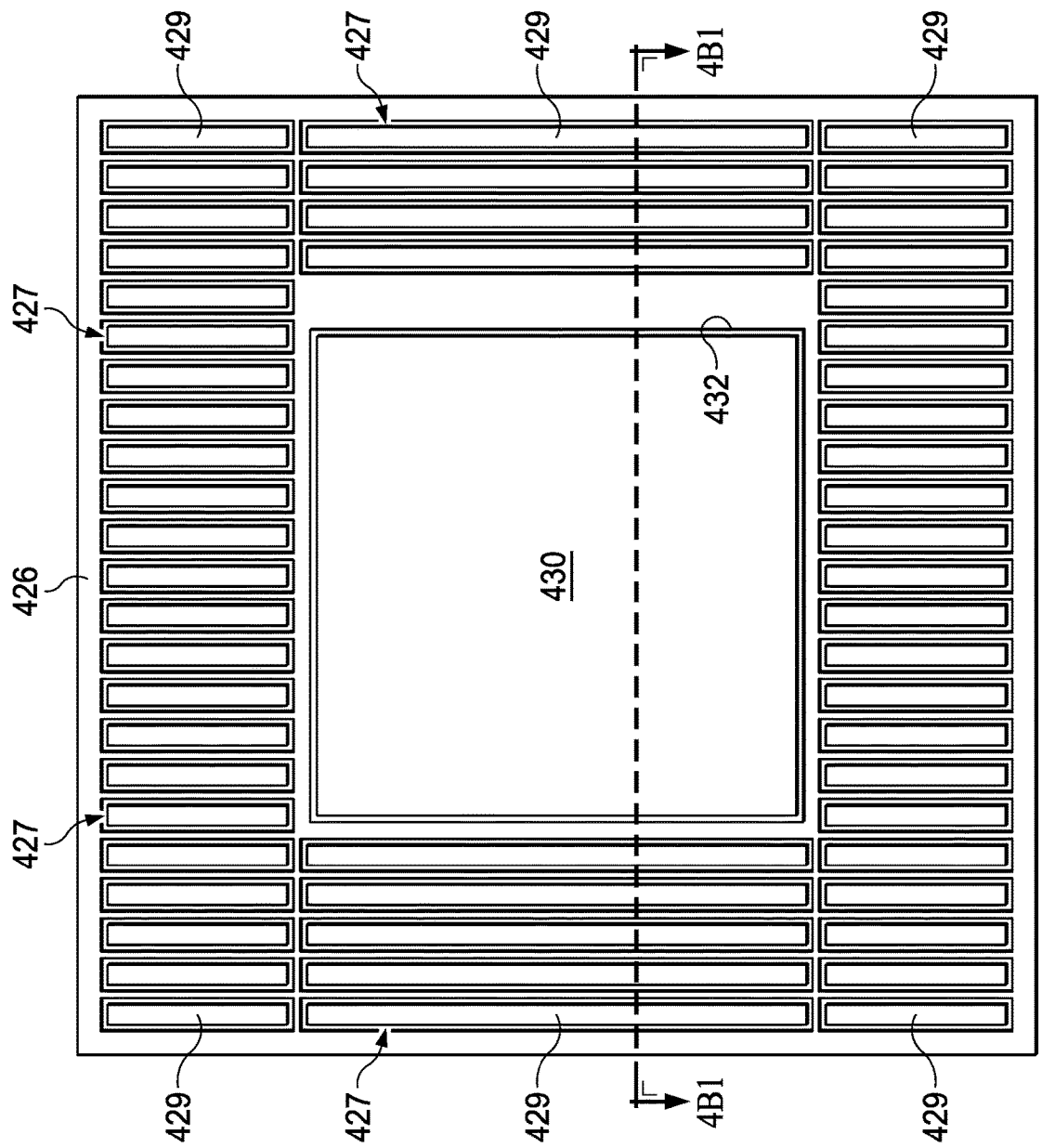
FIG. 4B2

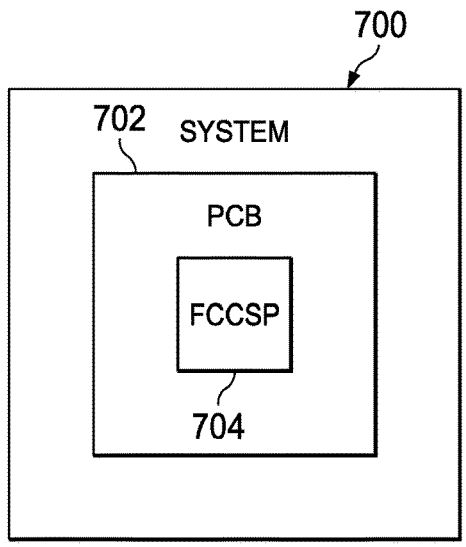
FIG. 7
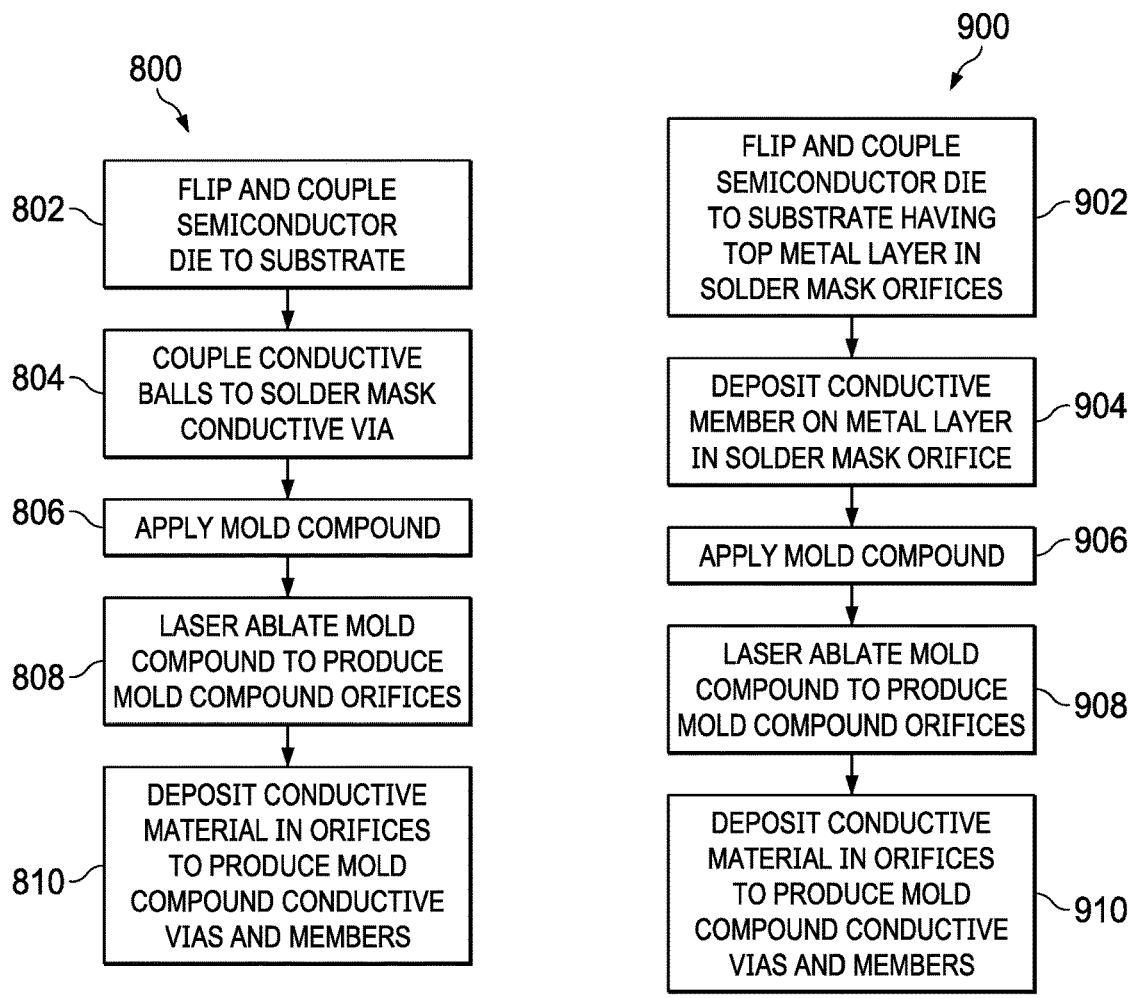
FIG. 8
FIG. 9

ENHANCED MOLD COMPOUND THERMAL CONDUCTIVITY

CROSS-REFERENCE TO RELATED APPLICATIONS

The present application claims priority to U.S. Provisional Patent Application No. 63/094,149, which was filed Oct. 20, 2020, is titled "In-Situ Thermal Conductivity Enhancement To Mold Compound During Semiconductor Package Assembly For Improved Heat Dissipation," and is hereby incorporated herein by reference in its entirety.

BACKGROUND

Semiconductor chips are often housed inside semiconductor packages that protect the chips from deleterious environmental influences, such as heat, moisture, and debris. A packaged chip communicates with electronic devices outside the package via conductive terminals, such as leads, that are exposed to surfaces of the package. Within the package, the chip may be electrically coupled to the conductive terminals using any suitable technique. One such technique is the flip-chip technique, in which the semiconductor chip (also called a "die") is flipped so the device side of the chip (in which circuitry is formed) is facing downward. The device side is coupled to the conductive terminals using, e.g., solder bumps.

SUMMARY

In examples, a semiconductor package comprises a semiconductor die having a first surface on which circuitry is formed and a second surface opposite the first surface. The semiconductor package includes a mold compound, the second surface facing the mold compound. The mold compound covers the semiconductor die; a set of conductive vias exposed to a top surface of the mold compound and coupled to a metal layer in the package; a set of first conductive members vertically aligned with the semiconductor die and exposed to the top surface of the mold compound; and a set of second conductive members coupling at least some of the set of conductive vias to at least some of the set of first conductive members. The set of second conductive members is exposed to the top surface of the mold compound.

In examples, a method comprises coupling a device side of a semiconductor die to a substrate; coupling a conductive ball to a first conductive via abutting a solder mask, the solder mask covering the substrate; covering the conductive ball with a mold compound layer; forming an orifice in the mold compound layer to expose the conductive ball; and depositing conductive material in the orifice to produce a second conductive via, the second conductive via coupled to the conductive ball.

BRIEF DESCRIPTION OF THE DRAWINGS

For a detailed description of various examples, reference will now be made to the accompanying drawings in which:

FIGS. 4A-4E are a process flow for manufacturing a FCCSP having enhanced thermal conductivity, in accordance with various examples.

FIG. 7 is a system containing a FCCSP having enhanced thermal conductivity, in accordance with various examples.

FIG. 8 is a flow diagram of a method for manufacturing a FCCSP having enhanced thermal conductivity, in accordance with various examples.

FIG. 9 is a flow diagram of a method for manufacturing a FCCSP having enhanced thermal conductivity, in accordance with various examples.

DETAILED DESCRIPTION

Figure 1A:
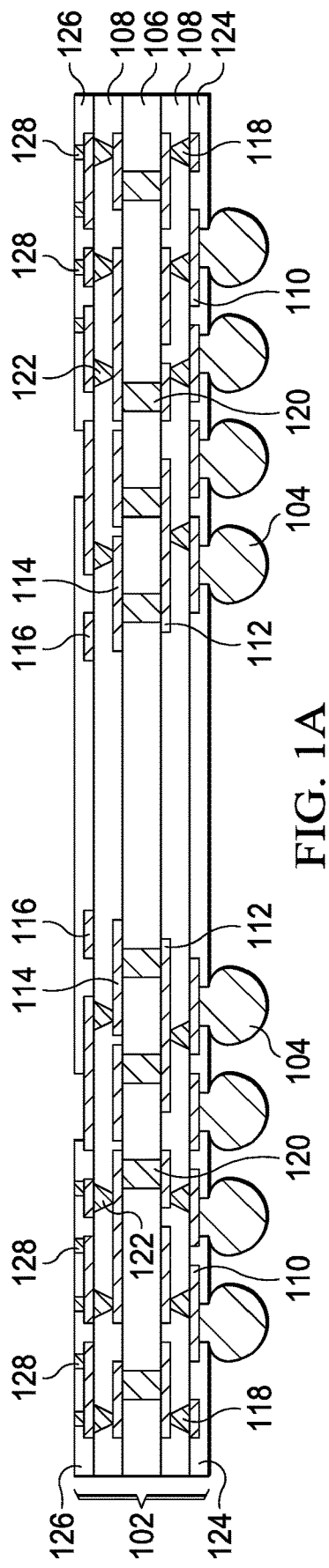
FIGS. 1A-1F are a process flow for manufacturing a flip-chip chip scale package (FCCSP) having enhanced thermal conductivity, in accordance with various examples.

Semiconductor packages can generate substantial amounts of heat during operation. A package may be designed to expel such heat to maintain the structural and functional integrity of the components within the package. In some flip-chip packages, a metal lid is coupled to the non-device side of the die and is mounted on top of the mold compound of the package. The metal lid expels heat from within the package. However, such lids add substantial bulk to the package and add considerable manufacturing expense, as well. In some packages, the mold compound is modified to include thermally conductive filler material, which may improve package heat dissipation. However, the modified mold compound still has limited thermal conductivity due to its polymeric nature, and the modified mold compound is substantially more expensive than conventional mold compounds.

This disclosure describes various examples of a semiconductor package, such as a flip-chip package (e.g., a FCCSP), having enhanced thermal conductivity without the use of a bulky and expensive lid or expensive thermally conductive filler materials in the mold compound. An example semiconductor package includes a semiconductor die having a device side on which circuitry is formed and a non-device side opposite the device side. The semiconductor package includes a mold compound covering the semiconductor die. The mold compound faces the non-device side of the semiconductor die. The mold compound covers a set of conductive vias extending from a top surface of the mold compound to a metal layer in the FCCSP. The mold compound covers a set of first conductive members vertically aligned with the semiconductor die and exposed to the top surface of the mold compound. The mold compound covers a set of second conductive members coupling the set of conductive vias to the set of first conductive members. The set of second conductive members is exposed to the top surface of the mold compound. The set of conductive vias, the set of first conductive members, and the set of second conductive members draw heat from within the semiconductor package (e.g., from the semiconductor die) and expel the heat to an exterior of the package. Because no thermally conductive fillers having thermal conductivity greater than the typically used silica fillers (e.g., greater than 1 W/mK) are used in the mold compound and because no lids are coupled to the semiconductor package, the thermal conductivity of the semiconductor package is substantially improved without a significant, if any, increase in cost. In addition, because no heat dissipating metal lids are used, package thickness is minimized, with package mold compound thicknesses not exceeding 150 microns.

FIGS. 1A-1F are a process flow for manufacturing a flip-chip chip scale package (FCCSP) having enhanced thermal conductivity, in accordance with various examples. FIG. 8 is a flow diagram of a method 800 for manufacturing a FCCSP having enhanced thermal conductivity, in accordance with various examples. Accordingly, FIGS. 1A-1F and 8 are now described in parallel.

The method 800 may begin with flipping and coupling a semiconductor die to a substrate (802). FIG. 1A shows a substrate 102 and solder balls 104 coupled to the substrate 102. The substrate 102 may include a core layer 106, which may be composed of a fiberglass-reinforced pre-preg material, for example. In examples, the substrate 102 also includes dielectric layers 108. The substrate 102 may include a metal layer 110 abutting one of the dielectric layers 108, a metal layer 112 abutting the same dielectric layer 108 as the metal layer 110 and the core layer 106, a metal layer 114 abutting the core layer 106 and the other dielectric layer 108, and a metal layer 116 abutting the same dielectric layer 108 as the metal layer 114. The substrate 102 may include a set of metal vias 118 that extend through a dielectric layer 108 to couple the metal layers 110 and 112 together. The substrate 102 also may include a set of metal vias 120 that extend through the core layer 106 to couple the metal layers 112 and 114 together. In examples, the substrate 102 includes a set of metal vias 122 that extend through a dielectric layer 108 to couple the metal layers 114 and 116 together. The substrate 102 may include a solder mask 124 that abuts the metal layer 110, and a solder mask 126 that abuts the metal layer 116. The solder mask 124 may include orifices through which the metal layer 110 couples to the solder balls 104. In examples, the solder mask 126 includes solder mask conductive vias 128 (e.g., composed of copper or solder) that extend through the solder mask 126 and that couple to the metal layer 116. The solder mask conductive vias 128 have a horizontal cross-sectional diameter ranging from 0.07 mm to 0.14 mm, where disadvantages associated with diameters outside of this range stem from substrate and assembly manufacturing constraints (e.g., solder mask registration limitations during substrate manufacturing that impacts adhesion to metal and/or continuity issues due to shorting). In examples, a different configuration of the substrate 102 may be useful. For instance, a substrate 102 with different numbers of metal layers, metal vias, and configurations thereof may be useful.

Figure 1B:
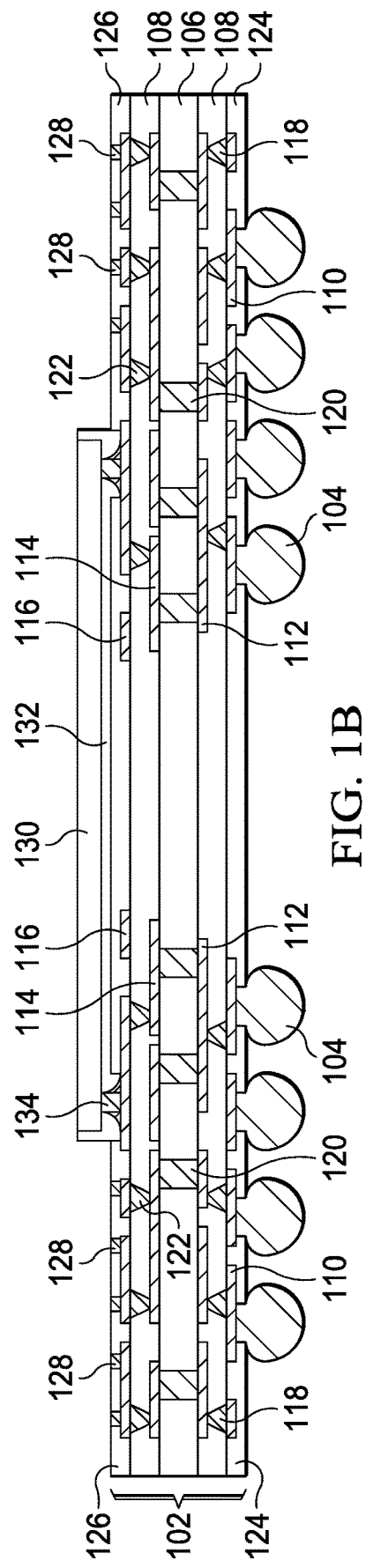

A semiconductor die 130 may be flipped and coupled to the substrate 102, as FIG. 1B shows. In examples, the semiconductor die 130 includes a device side on which circuitry is formed. The semiconductor die 130 may include a non-device side opposite the device side. Because the semiconductor die 130 has a flip-chip orientation, the device side of the semiconductor die 130 may face downward (e.g., the substrate), and the non-device side of the semiconductor die 130 may face upward. The device side of the semiconductor die 130 may be coupled to the metal layer 116 by way of one or more conductive pillars 134. In examples, the semiconductor die 130 abuts a capillary underfill 132 as shown, although a molded underfill material may be used instead.

Figure 1C:
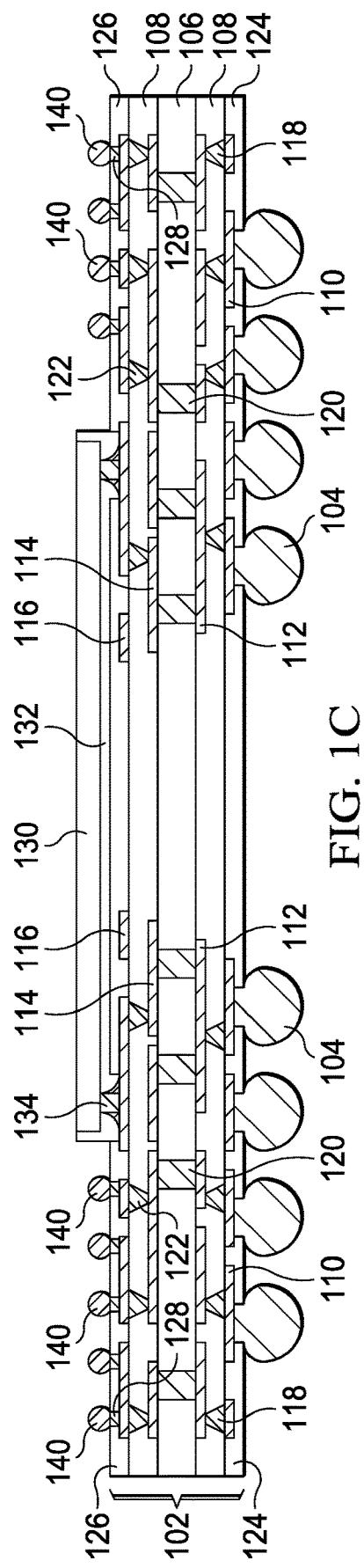

The method 800 may include coupling conductive balls to the solder mask conductive vias (804). FIG. 1C shows conductive balls 140 coupled to the solder mask conductive vias 128, thereby establishing a thermally and electrically conductive pathway from the conductive balls 140 to the metal layer 116, with the metal layer 116, in turn, having a thermally and electrically conductive pathway through the various metal layers and metal vias of the substrate 102 to the solder balls 104. The conductive balls 140 may be formed and coupled to the solder mask conductive vias 128 using any suitable technique. For example, a copper conductive ball 140 may be formed by screen printing or a ball dip process. In examples, each of the conductive balls 140 has a diameter ranging from 0.3 to 0.5 mm, where disadvantages associated with diameters outside of this range stem from substrate and assembly manufacturing capabilities and constraints (e.g., shorting between balls caused by tighter pitches).

Figure 1D:
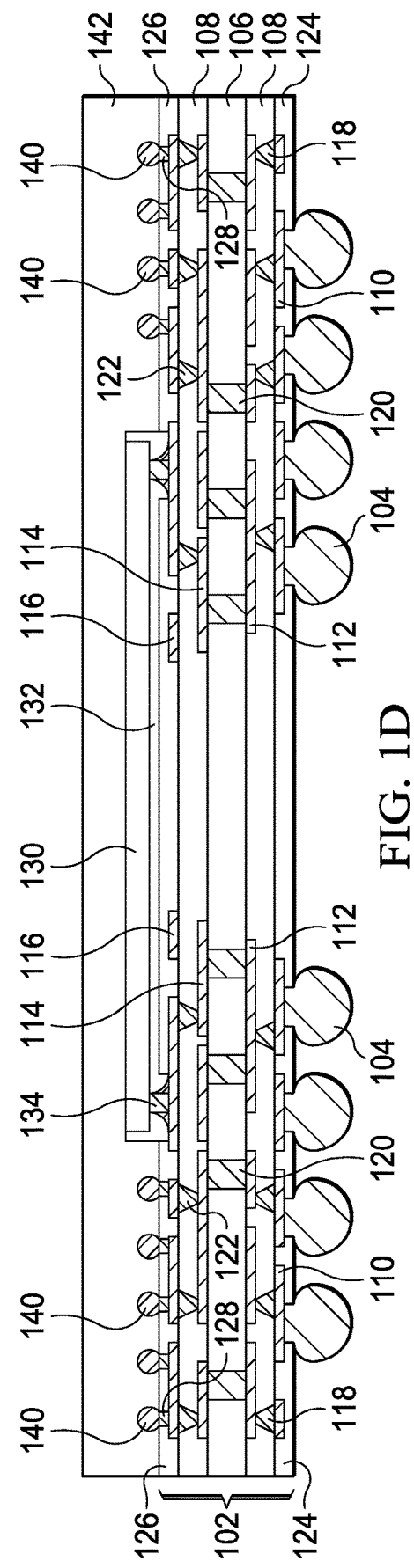

The method 800 may include applying a mold compound (806). FIG. 1D shows the application of a mold compound 142, for example, using a mold chase and a mold injection technique. The mold compound 142 abuts the conductive balls 140, the solder mask 126, and the non-device side of the semiconductor die 130.

Figure 1E:
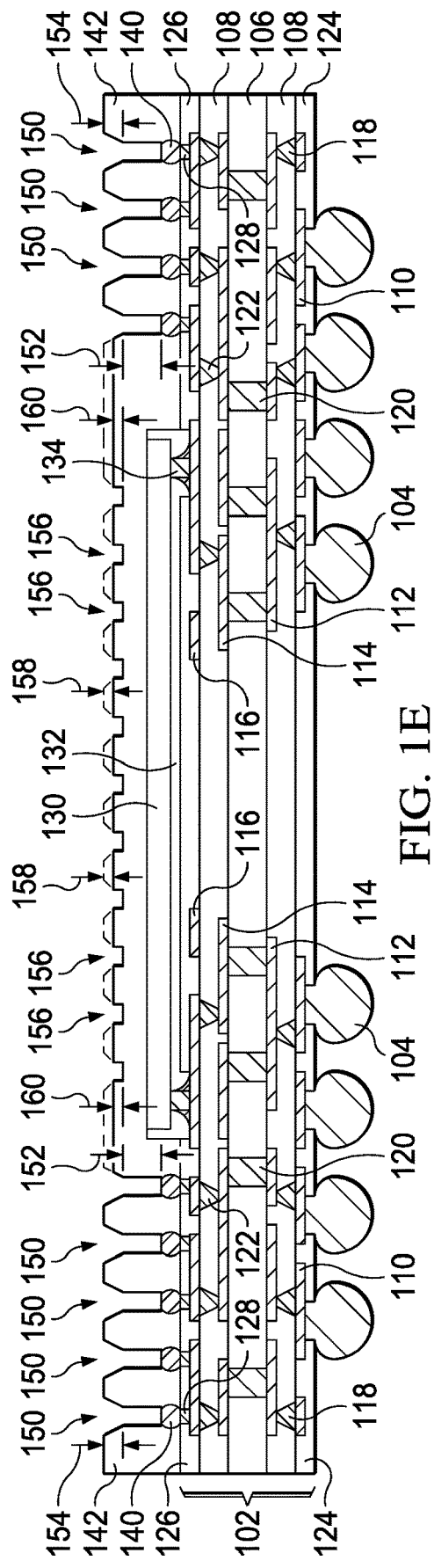

The method 800 may include laser ablating the mold compound to produce mold compound orifices (808). Laser ablation is the process of removing material from a solid surface by irradiating the solid surface with a laser beam. In examples, laser ablation may include use of a diode pumped Nd:YAG laser. Laser ablation may include the application of the laser in a strength range of 15-20 watts, for 5-12 seconds or a length of time as may be appropriate, with a single or multiple iterative applications, as may be appropriate. FIG. 1E shows the mold compound 142 having multiple mold compound orifices 150 and 156. The mold compound orifices 150 are vertically aligned with the conductive balls 140. The mold compound orifices 156 are vertically aligned with the semiconductor die 130. As shown, in some examples, the mold compound orifices 150 extend through the full thickness of the mold compound 142 such that the conductive balls 140 are exposed to the mold compound orifices 150. Conversely, as shown, in some examples, the mold compound orifices 156 do not reach the non-device side of the semiconductor die 130. Instead, at least some of the mold compound 142 is positioned between the mold compound orifices 156 and the non-device side of the semiconductor die 130.

Because a laser ablation technique is used, the horizontal cross-sectional diameter of each of the mold compound orifices 150 is approximately uniform in a first segment 152 and progressively enlarges through a second segment 154. This cross-sectional diameter ranges from 0.55 mm to 0.7 mm, with diameters below this range being disadvantageous because of a reduction in thermal conductivity, and with diameters above this range being disadvantageous because of unacceptably reduced assembly throughput. Similarly, the horizontal cross-sectional diameter of each of the mold compound orifices 156 is approximately uniform in a first segment 160 and progressively enlarges through a second segment 158. This cross-sectional diameter ranges from 0.55 mm to 0.7 mm, with diameters below this range being disadvantageous because of unacceptably reduced thermal conductivity, and with diameters above this range being disadvantageous because of unacceptably reduced assembly throughput. Further, as indicated by the dashed lines, laser ablation may be used to reduce the thickness of the mold compound 142 between the mold compound orifices 156, as well as between the left-most mold compound orifice 156 and the right-most mold compound orifice 150, as shown. Techniques other than laser ablation (e.g., mechanical polishing) are contemplated and included in the scope of this disclosure.

In examples, the method 800 comprises depositing thermally conductive material in the mold compound orifices to produce conductive vias and conductive members (810).

Figure 1F:
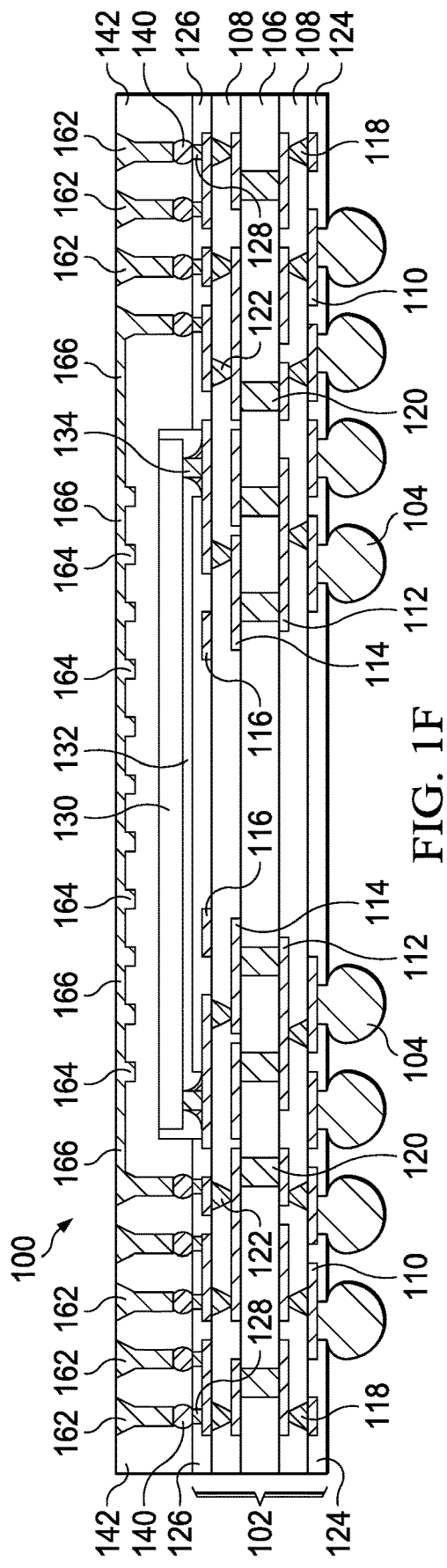

FIG. 1F shows the various mold compound orifices 150, 156 (FIG. 1E) filled with thermally conductive material, such as copper or solder. In examples, the thermally conductive material is deposited using screen-printing techniques. In examples, the thermally conductive material is deposited using dispensing techniques. In examples, the thermally conductive material is deposited using ink jet techniques. In examples, the thermally conductive material is a thermally conductive paste, such as a solder paste, copper paste, or other metal or metallic alloy paste. Depositing thermally conductive material into the various mold compound orifices produces conductive vias 162 and conductive members 164. As with the mold compound orifices 150, the conductive vias 162 extend through the thickness of the mold compound 142, and they are vertically aligned with and contact the conductive balls 140. Thus, the conductive vias 162 form a thermally conductive pathway from the conductive balls 140 to a top surface of the mold compound 142. The conductive vias 162 are exposed to the top surface of the mold compound 142. The above description of the dimensions of the mold compound orifices 150 also applies to the conductive vias 162.

As with the mold compound orifices 156, in some examples, the conductive members 164 extend through the mold compound 142 but do not reach the non-device side of the semiconductor die 130. At least some of the mold compound 142 is positioned between the conductive members 164 and the non-device side of the semiconductor die 130. The distance between the non-device side of the semiconductor die 130 and the bottom ends of the conductive members 164 ranges from 0.1 mm to 0.2 mm, with distances below this range being disadvantageous due to assembly process constraints, and with distances above this range being disadvantageous because of poor thermal performance. The conductive members 164 are exposed to the top surface of the mold compound 142. The conductive members 164 are vertically aligned with the semiconductor die 130. The above description of the dimensions of the mold compound orifices 156 also applies to the conductive members 164.

One or more of the conductive vias 162 may be coupled to one or more of the conductive members 164 by way of conductive members 166. Similarly, conductive members 166 may couple different conductive vias 162 to each other, and/or different conductive members 164 to each other. In examples, the conductive members 166 extend horizontally, unlike the conductive vias 162, which extend vertically, and the conductive members 164, which also extend vertically.

The example conductive members 166 shown in FIG. 1F are produced by depositing thermally conductive material (e.g., metallic paste) on top of the mold compound 142 in areas between mold compound orifices 150 and/or 156 that were laser ablated, as described above and as shown in FIG. 1E. The fabrication of such conductive members 166 coupling various conductive vias 162 and/or members 164 encourages heat spread and, thus, efficient heat dissipation, particularly in the horizontal direction. The conductive members 166 are exposed to the top surface of the mold compound 142. The conductive members 166 have a diameter ranging from 0.55 mm to 0.7 mm, with diameters below this range being disadvantageous because of unacceptably reduced thermal conductivity, and with diameters above this range being disadvantageous because of a negative impact on assembly throughput. The structure of FIG. 1F is an example of a completed FCCSP 100.

Figure 2:
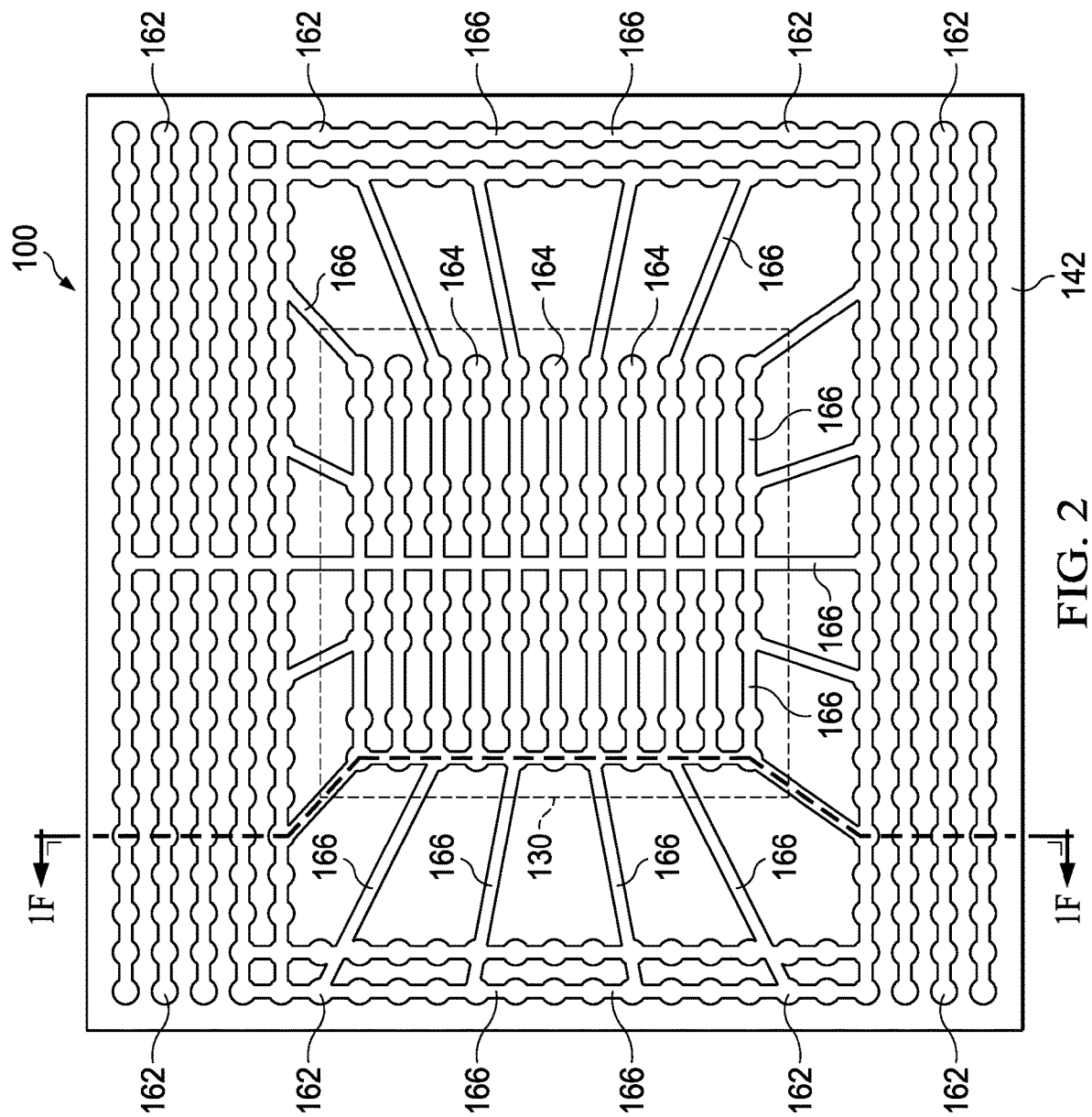
FIG. 2 is a top-down view of a FCCSP having enhanced thermal conductivity, in accordance with various examples.

FIG. 2 is a top-down view of the FCCSP 100. An outline of the semiconductor die 130 is shown in the horizontal center of the FCCSP 100, although the semiconductor die 130 need not necessarily be positioned in the horizontal center of the FCCSP 100. The conductive vias 162 are arranged along the periphery of the FCCSP 100, and the conductive vias 162 may be any suitable number of rows deep. For example, as shown, the conductive vias 162 may be two rows deep in some areas of the periphery of the FCCSP 100, four rows deep in other areas of the periphery of the FCCSP 100, and five rows deep in still other areas of the periphery of the FCCSP 100. FIG. 2 also shows the conductive members 164 vertically aligned with the semiconductor die 130. As with the conductive vias 162, any number and/or configuration of conductive members 164 may be used. FIG. 2 also shows multiple conductive members 166 that couple various vias 162 to other vias 162, conductive members 164 to other members 164, and/or vias 162 or members 164, in any suitable number, combination, and configuration.

Figure 3:
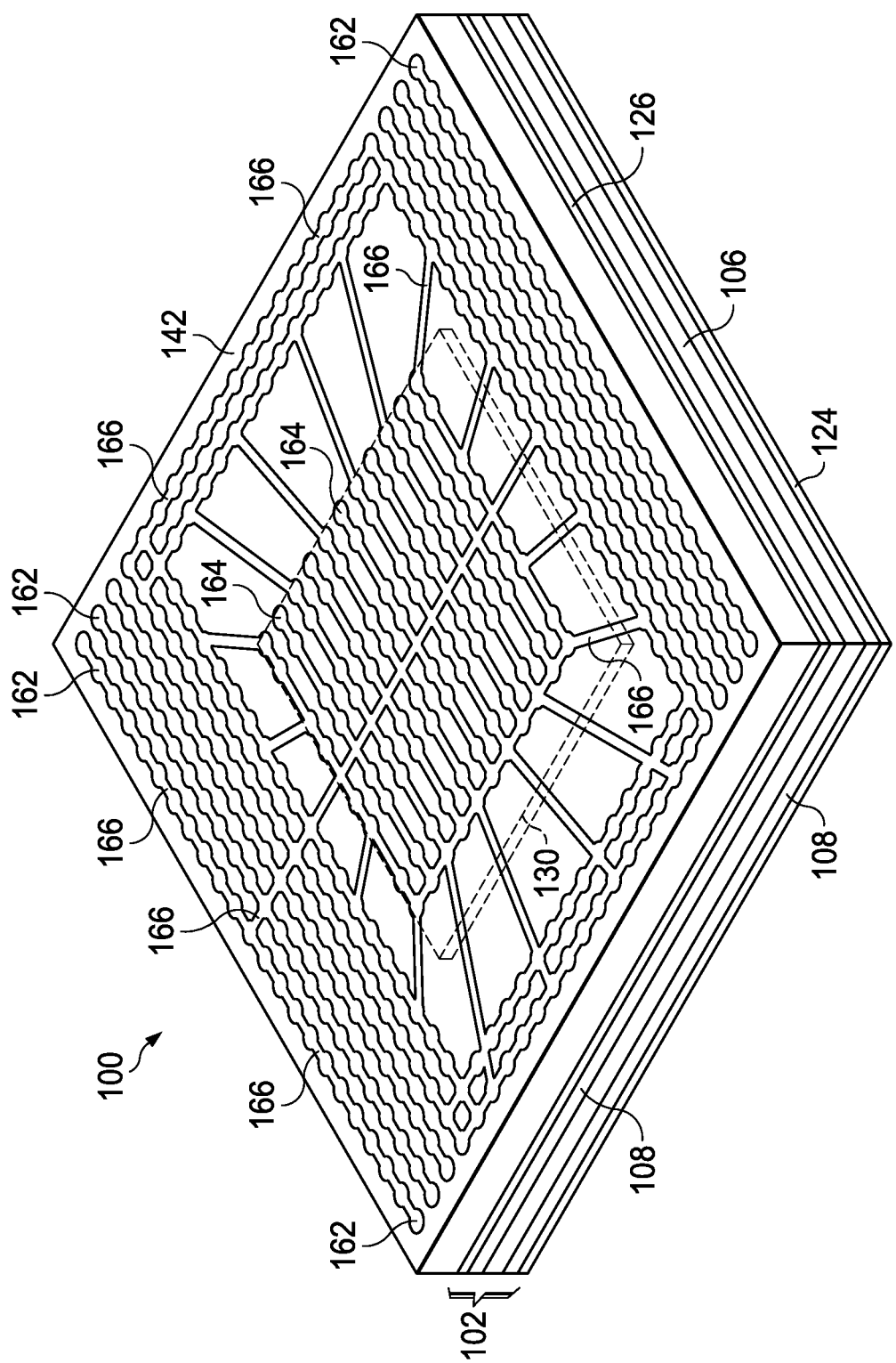
FIG. 3 is a perspective view of a FCCSP having enhanced thermal conductivity, in accordance with various examples.

The FCCSP 100 provides superior heat dissipation through the mold compound 142 relative to conventional packages. As shown in Table 1 below, in an example in which the conductive vias 162 and members 164 have a pitch ranging from 0.5 mm to 0.8 mm and diameters ranging from 0.25 mm to 0.38 mm, the thermal conductivity of the mold compound 142 (which may have an example baseline thermal conductivity of approximately 0.9 watts per meter-Kelvin) increases by a factor of 43-85 or more in the vertical direction relative to conventional packages, and by a factor of 1.34-1.61 or more in the horizontal direction. Pitches outside of the 0.5 mm to 0.8 mm range may result in disadvantages including inadequate heat dissipation or unacceptably increased expense. In some examples, conductive vias 162 and members 164 having a pitch of approximately 0.8 mm and a diameter of approximately 350 microns, and a conductive member 166 depth of approximately 30 microns and width of approximately 310 microns in a mold compound 142 material having a baseline thermal conductivity of 1 W/mK results in a vertical thermal conductivity of approximately 58 W/mK and a horizontal thermal conductivity of approximately 7.6 W/mK. FIG. 3 is a perspective view of the FCCSP 100.

TABLE 1

| Pitch (mm) | Diameter (mm) | Conventional mold compound thermal conductivity (W/mK) | FCCSP 100 vertical thermal conductivity (W/mK) | FCCSP 100 horizontal thermal conductivity (W/mK) |
| --- | --- | --- | --- | --- |
| 0.8 | 0.38 | 0.9 | 68 | 1.54 |
| 0.8 | 0.35 | 0.9 | 58 | 1.45 |
| 0.8 | 0.3 | 0.9 | 43 | 1.34 |
| 0.65 | 0.3 | 0.9 | 65 | 1.51 |
| 0.65 | 0.25 | 0.9 | 46 | 1.36 |
| 0.5 | 0.25 | 0.9 | 77 | 1.61 |

FIGS. 4A-4E are a process flow for manufacturing a FCCSP having enhanced thermal conductivity, in accordance with various examples. FIG. 9 is a flow diagram of a method 900 for manufacturing a FCCSP having enhanced thermal conductivity, in accordance with various examples. Accordingly, FIGS. 4A-4E and 9 are now described in parallel.

The method 900 may include flipping and coupling a semiconductor die to a substrate having a top metal layer in a solder mask orifice (902), and depositing a conductive member on the top metal layer in the solder mask orifice (904). FIG. 4A shows a substrate 402 having components that are similar to those of substrate 102 described above, with like numerals referring to like components. FIG. 4B1 shows the structure of FIG. 4A but with the addition of a semiconductor die 430, capillary underfill 432, conductive pillar 434, and conductive members 429, as shown. Specifically, a solder mask 426 includes multiple solder mask orifices 427. Segments of a metal layer 416 are positioned within these solder mask orifices 427. Conductive members 429 are also positioned in the solder mask orifices 427 and are coupled to the metal layer 416, as shown. The conductive members 429 may be applied using any suitable technique, such as the application of a conductive material paste The solder mask orifices 427 have lengths ranging from 0.25 mm to 0.5 mm in the horizontal plane and widths ranging from 0.1 mm to 0.2 mm in the horizontal plane. (A non-solder mask defined metal layer 416 and/or conductive members 429 facilitate thermal spreading.) Solder mask orifice 427 dimensions outside these ranges provide challenging routing design considerations and chip-to-package interaction effects. The conductive members 429 have lengths ranging from 0.225 mm to 0.45 mm in the horizontal plane and widths ranging from 0.95 mm to 0.195 mm in the horizontal plane. Conductive member 429 dimensions outside of these ranges provide routing design challenges and deleterious chip-to-package interaction effects. Each conductive member 429 may be separated from its neighboring segment of the solder mask 426 by a distance ranging from 0.4 mm to 0.5 mm, with a distance less than this range being disadvantageous because of routing design challenges, and a distance greater than this range being disadvantageous because of unacceptably reduced thermal dissipation. The conductive members 429 have thicknesses ranging from 0.01 mm to 0.02 mm, with thicknesses outside of this range presenting manufacturing and reliability challenges. FIG. 4B2 is a top-down view of the structure of FIG. 4B1. The conductive members 429 may be of any suitable number and be arranged in any suitable configuration.

Figure 4C:
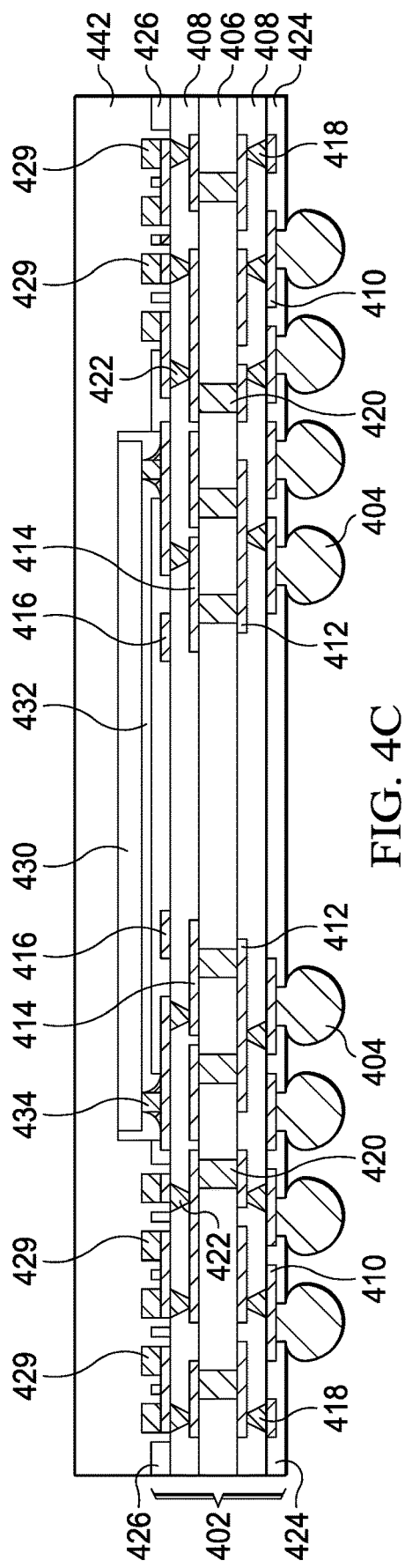
Figure 4D:
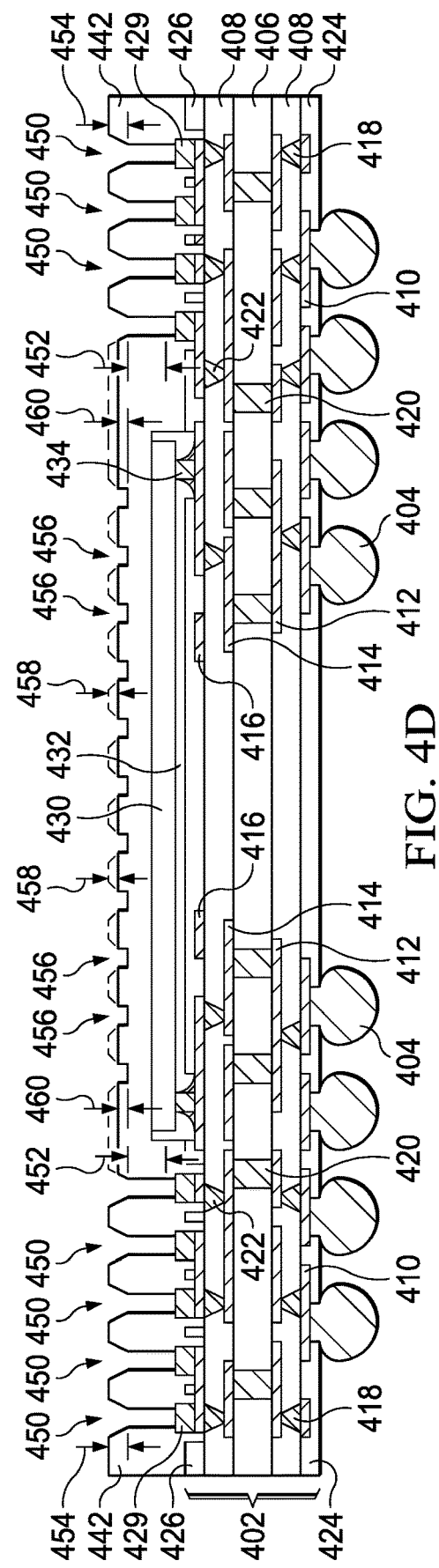

The method 900 may include applying a mold compound (906). FIG. 4C shows the application of a mold compound 442. The method 900 may include laser ablating the mold compound to produce mold compound orifices (908). FIG. 4D shows the creation of mold compound orifices 450 and 456. The details of the mold compound orifices 450 and 456 are similar to those described above for the mold compound orifices 150 and 156, with like numerals referring to like components.

Figure 4E:
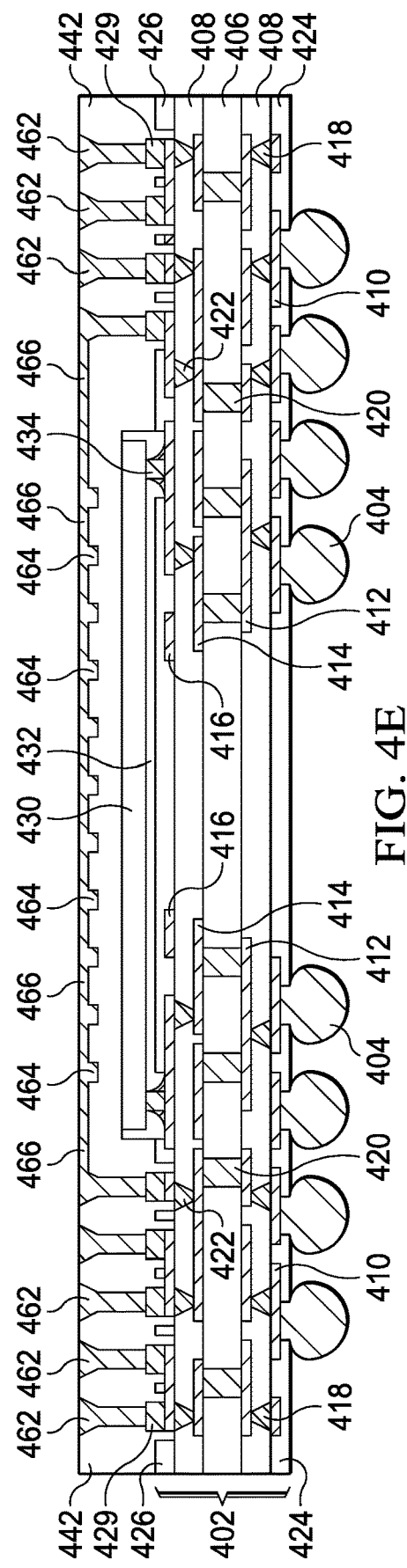

The method 900 may include depositing conductive material in mold compound orifices to produce conductive vias and conductive members (910). FIG. 4E shows conductive vias 462 and conductive members 464 and 466. The details of the conductive vias 462, the conductive members 464, and the conductive members 466 are the same as described above for the conductive vias 162, the conductive members 164, and the conductive members 166, respectively, and thus they are not repeated here. Like numerals refer to like components. The completed structure of FIG. 4E is an FCCSP 400.

Figure 5:
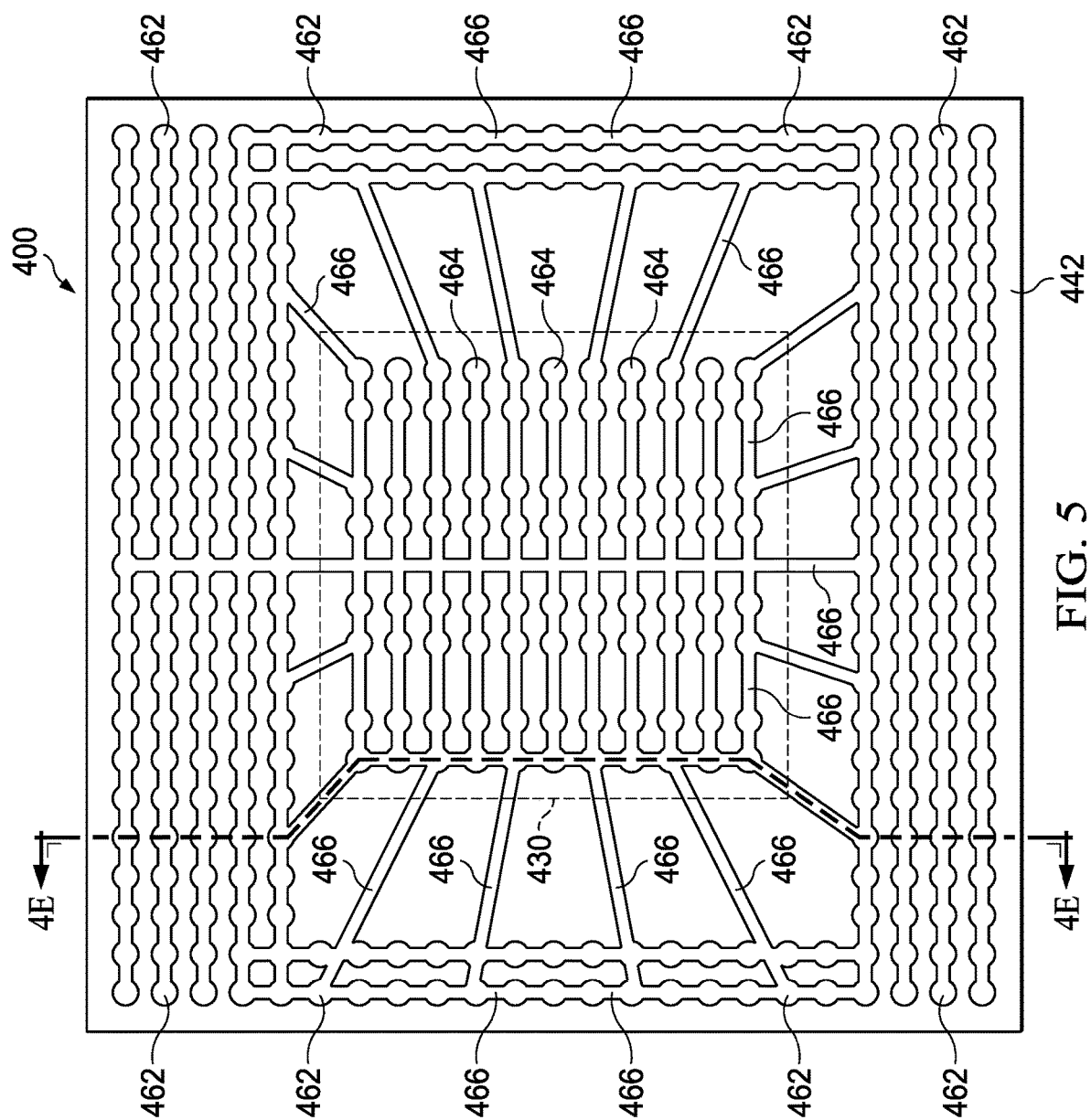
FIG. 5 is a top-down view of a FCCSP having enhanced thermal conductivity, in accordance with various examples.
Figure 6:
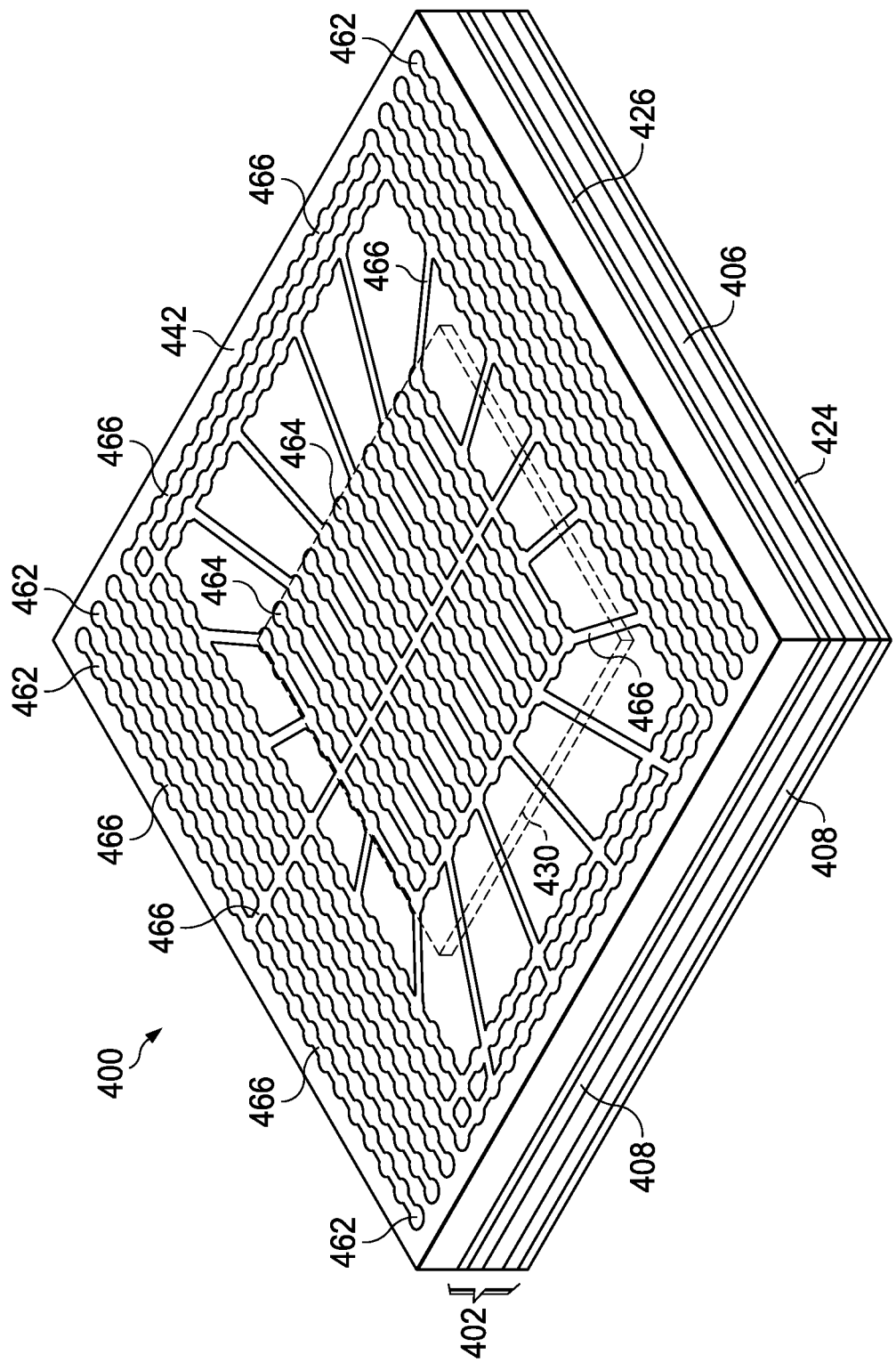
FIG. 6 is a perspective view of a FCCSP having enhanced thermal conductivity, in accordance with various examples.

FIG. 5 is a top-down view of the FCCSP 400, in accordance with various examples. The view shown in FIG. 5 is analogous to the view shown in FIG. 2, and thus is not described again here. The pitch ranges between the conductive vias 462 and/or conductive members 464 are the same as for the conductive vias 162 and/or the conductive members 164 described above, and thus are not repeated here. FIG. 6 is a perspective view of the FCCSP 400 and is analogous to the view of FIG. 3, and thus is not described again here.

FIG. 7 is a system 700 containing a FCCSP (e.g., FCCSP 200 and/or 400) having enhanced thermal conductivity, in accordance with various examples. Examples of the system 700 may include applications such as personal electronics (e.g., smartphones, laptop computers, desktop computers, tablets, notebooks, artificial intelligence assistants), appliances (e.g., refrigerators, microwave ovens, toaster ovens, dishwashers), networking or enterprise-level electronics (e.g., servers, routers, modems, mainframe computers, wireless access points), automobiles and aviation (e.g., control panels, entertainment devices, navigation devices, power electronics), and numerous other electronic systems. The system 700 includes a PCB 702 upon which any number of semiconductor packages, passive components, metal traces, etc. may be positioned, including an FCCSP 704. The FCCSP 704 is representative of any of the FCCSPs described herein, such as the FCCSPs 200 and/or 400.

The term "couple" is used throughout the specification. The term may cover connections, communications, or signal paths that enable a functional relationship consistent with this description. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

Unless otherwise stated, "about," "approximately," or "substantially" preceding a value means+/−10 percent of the stated value. Modifications are possible in the described examples, and other examples are possible within the scope of the claims.

What is claimed is:

1. A semiconductor package, comprising:
   a semiconductor die having a first surface on which circuitry is formed and a second surface opposite the first surface; and
   a mold compound, the second surface facing the mold compound, the mold compound physically contacting:
   the semiconductor die;
   a set of conductive vias exposed to a top surface of the semiconductor package and coupled to a metal layer in the package;
   a set of first conductive members vertically aligned with the semiconductor die and exposed to the top surface of the semiconductor package; and
   a set of second conductive members coupling at least some of the set of conductive vias to at least some of the set of first conductive members, the set of second conductive members exposed to the top surface of the semiconductor package.

2. The package of claim 1, wherein each of the set of conductive vias has a diameter ranging from 0.55 mm to 0.7 mm, and wherein each of the set of first conductive members has a diameter ranging from 0.55 mm to 0.7 mm.

3. The package of claim 1, wherein the set of conductive vias and the set of first conductive members extend vertically, and wherein the set of second conductive members extend horizontally.

4. The package of claim 1, wherein at least one of the set of conductive vias includes a first segment having an approximately uniform horizontal cross-sectional diameter and a second segment having a progressively enlarging horizontal cross-sectional diameter, the second segment positioned closer to the top surface of the semiconductor package than the first segment.

5. The package of claim 1, further comprising a solder mask in a substrate of the package, the solder mask including a solder mask orifice, the metal layer positioned in the solder mask orifice.

6. A semiconductor package, comprising:
  a substrate including a metal layer and a solder mask abutting the metal layer, the solder mask abutting a first conductive via coupled to the metal layer;
  a semiconductor die having a first surface on which circuitry is formed and a second surface opposite the first surface, the first surface facing the metal layer and coupled to the metal layer; and
  a mold compound covering the solder mask and the semiconductor die, the mold compound physically contacting:
    a second conductive via coupled to the first conductive via, the second conductive via exposed to a top surface of the semiconductor package;
    a first conductive member vertically aligned with the semiconductor die and facing the second surface of the semiconductor die, the first conductive member exposed to the top surface of the semiconductor package; and
    a second conductive member coupling the second conductive via to the first conductive member.

7. The semiconductor package of claim 6, wherein the semiconductor package is a flip-chip chip scale package (FCCSP).

8. The semiconductor package of claim 6, wherein at least some of the mold compound is positioned between the first conductive member and the second surface of the semiconductor die.

9. The semiconductor package of claim 6, wherein the second conductive via includes a first segment having an approximately uniform horizontal cross-sectional diameter and a second segment having a progressively enlarging horizontal cross-sectional diameter, the second segment positioned closer to the top surface of the semiconductor package than the first segment.

10. The semiconductor package of claim 6, wherein a pitch between the second conductive via and a third conductive via most proximate to the second conductive via ranges from 0.5 mm to 0.8 mm.

11. The semiconductor package of claim 10, wherein the second conductive via has a cross-sectional diameter ranging from 0.55 mm to 0.7 mm.

12. A semiconductor package, comprising:
  a substrate including a metal layer and a solder mask, the solder mask including a solder mask orifice within which the metal layer is positioned;
  a first conductive member coupled to the metal layer;
  a semiconductor die having a first surface on which circuitry is formed and a second surface opposite the first surface, the first surface facing the metal layer and coupled to the metal layer;
  a mold compound covering the solder mask and the semiconductor die, the mold compound physically contacting:
    a conductive via coupled to the first conductive member; and
    a second conductive member vertically aligned with the semiconductor die, the second surface of the semiconductor die facing the second conductive member.

13. The semiconductor package of claim 12, wherein the first conductive member is positioned in the solder mask orifice.

14. The semiconductor package of claim 13, wherein the first conductive member does not contact the solder mask.

15. The semiconductor package of claim 12, further comprising a third conductive member coupling the conductive via to the second conductive member.

16. The semiconductor package of claim 15, wherein the third conductive member is exposed to a top surface of the mold compound.

17. The semiconductor package of claim 12, wherein the conductive via and the second conductive member are exposed to a top surface of the mold compound.

18. The semiconductor package of claim 12, wherein the first conductive member is composed of a metallic paste.

19. The semiconductor package of claim 12, wherein the conductive via includes a first segment having an approximately uniform cross-sectional diameter and a second segment having a progressively enlarging cross-sectional diameter, the second segment positioned closer to a top surface of the mold compound than the first segment.

20. The semiconductor package of claim 12, wherein at least some of the mold compound is positioned between the second conductive member and the second surface of the semiconductor die.

* * * * *